(12) United States Patent
Zimmer

(10) Patent No.: US 10,520,556 B2
(45) Date of Patent: Dec. 31, 2019

(54) OFFSET VOLTAGE COMPENSATION

(71) Applicant: Infineon Technologies AG, Neubiberg (DE)

(72) Inventor: Juergen Zimmer, Neubiberg (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 15/836,318

(22) Filed: Dec. 8, 2017

(65) Prior Publication Data
US 2018/0100900 A1 Apr. 12, 2018

Related U.S. Application Data

(63) Continuation of application No. 14/625,038, filed on Feb. 18, 2015.

(51) Int. Cl.
*G01R 33/09* (2006.01)
*G01R 33/00* (2006.01)

(52) U.S. Cl.
CPC ..... *G01R 33/0017* (2013.01); *G01R 33/0029* (2013.01); *G01R 33/098* (2013.01)

(58) Field of Classification Search
CPC ...... G01R 33/06; G01R 33/09; G01R 33/091; G01R 33/093; G01R 33/095; G01R 33/096; G01R 33/098; G01R 33/07; G01R 33/072; G01R 33/075; G01R 33/077; G01R 33/0017; G01R 33/0029; H01L 43/00; H01L 43/08; G01D 5/142; G01D 5/145; G01D 5/147
See application file for complete search history.

(56) References Cited

U.S. PATENT DOCUMENTS

| | | | |
|---|---|---|---|
| 3,818,184 A * | 6/1974 | Habfast | G01R 33/06 219/499 |
| 4,798,093 A | 1/1989 | Kenoun | |
| 5,726,564 A | 3/1998 | Takashima | |
| 9,536,926 B1 | 1/2017 | Annunziata et al. | |
| 9,711,237 B2 * | 7/2017 | Chung | G11C 29/027 |
| 2003/0107373 A1 * | 6/2003 | Van Zon | G01R 33/09 324/252 |
| 2011/0025319 A1 | 2/2011 | Saruki et al. | |
| 2012/0262164 A1 * | 10/2012 | Bartos | G01R 33/09 324/252 |
| 2013/0342273 A1 | 12/2013 | Petrie | |
| 2015/0016163 A1 | 1/2015 | Krainer et al. | |
| 2015/0042319 A1 * | 2/2015 | Furuichi | G01R 33/096 324/202 |
| 2016/0154031 A1 | 6/2016 | Masson et al. | |

FOREIGN PATENT DOCUMENTS

CN 1704742 A 12/2005
DE 10342260 B4 11/2014

* cited by examiner

*Primary Examiner* — David M Schindler
(74) *Attorney, Agent, or Firm* — Schiff Hardin LLP

(57) ABSTRACT

A bridge circuit having a full-bridge circuit having a first branch and a second branch coupled in parallel, the first branch comprising a first half-bridge circuit and a first tunnel magnetoresistance (TMR) resistor cascade coupled in series, and the second branch comprising a second half-bridge circuit and a second TMR resistor cascade coupled in series, wherein the full-bridge circuit has an offset voltage of zero or substantially close to zero.

6 Claims, 8 Drawing Sheets

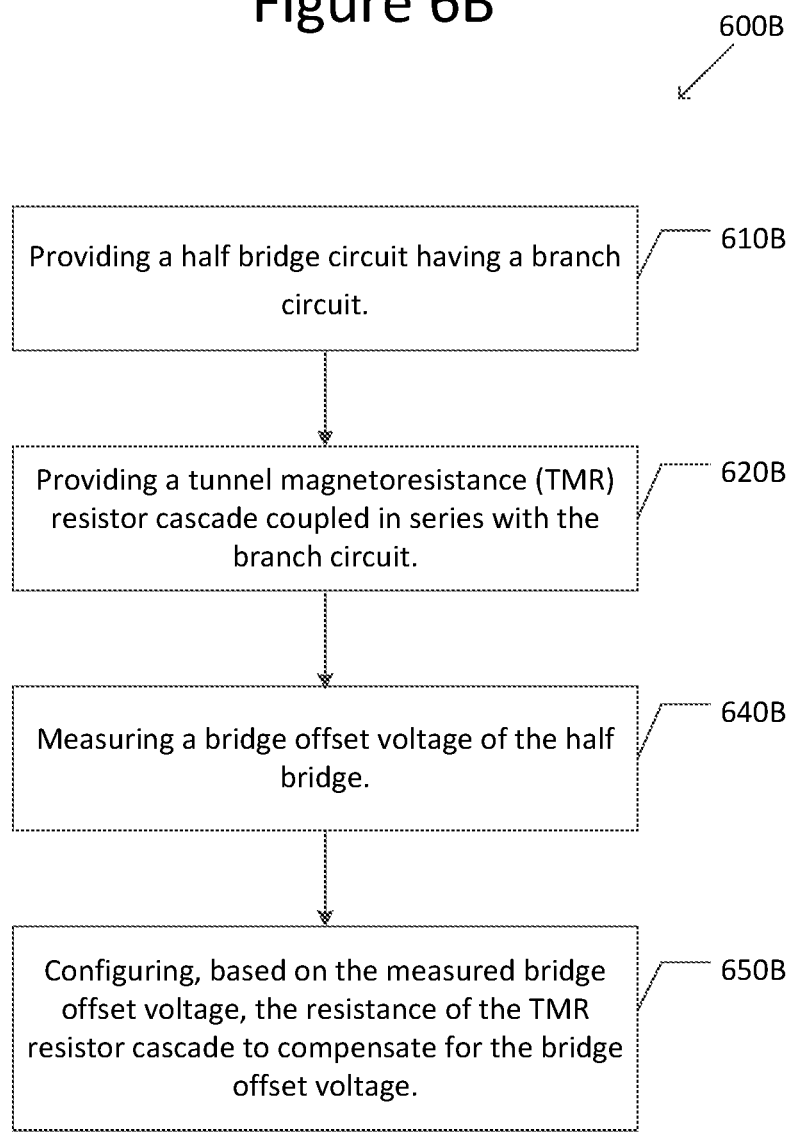

OFFSET VOLTAGE COMPENSATION

BACKGROUND

A Wheatstone bridge is an electrical circuit used to measure an unknown electrical resistance by balancing two branches of the bridge, one branch of which includes the unknown resistance. In order to obtain an optimum performance when the Wheatstone bridge is used in a sensor, such as an angle sensor, the bridge offset voltage needs to be calibrated on the chip. Usually the bridge offset voltage exhibits a temperature coefficient which might lead to significant offsets at temperatures different from the temperature at which the bridge offset voltage was calibrated.

BRIEF DESCRIPTION OF THE DRAWINGS

FIG. 6B illustrates a flowchart of a method for compensating for a bridge offset voltage in a half bridge.

DETAILED DESCRIPTION

The present disclosure is directed to a TMR resistor cascade used to compensate for a bridge offset voltage. A resistance adjustment of the TMR resistor cascade may be accomplished using laser fuses, or alternatively, by switches or by shorting individual TMR resistors of the cascade. Additionally, a combination of the TMR resistor cascade and a bottom electrode resistor cascade having opposing temperature coefficients may be used to result in an offset voltage compensation having a temperature coefficient of zero or substantially close to zero.

Figure 1A:
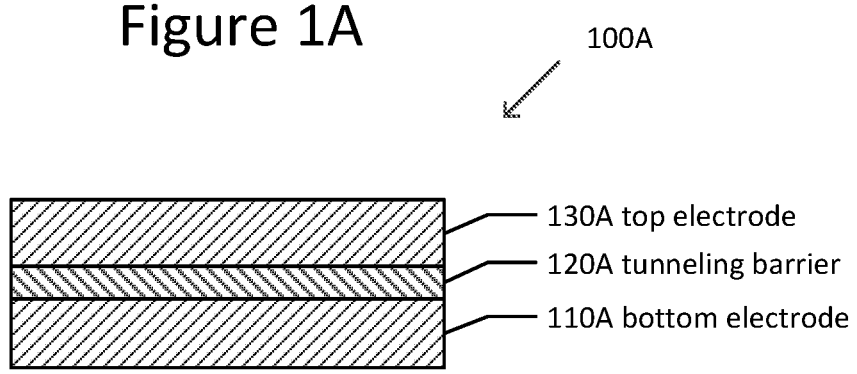
FIG. 1A illustrates a tunnel magnetoresistance (TMR) stack.
Figure 1B:
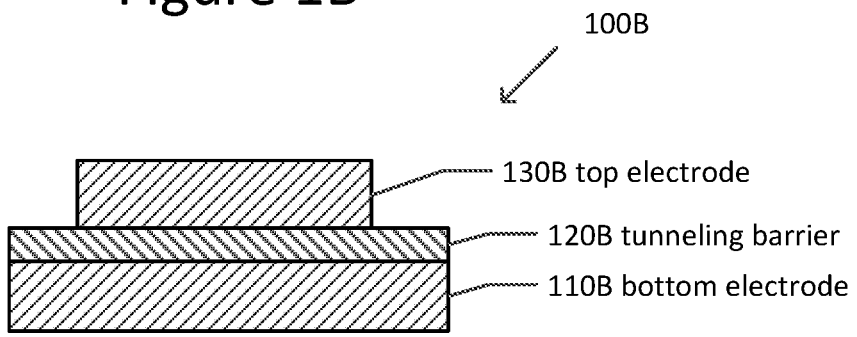
FIG. 1B illustrates a TMR resistor.
Figure 1C:
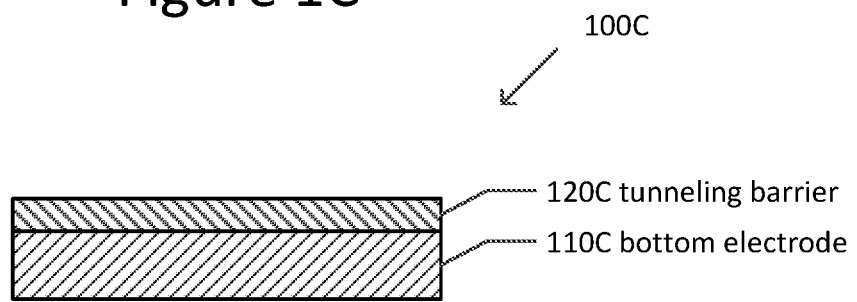
FIG. 1C illustrates a bottom electrode resistor.

FIGS. 1A-1C illustrate basic components used to compensate for bridge offset voltage as disclosed herein.

FIG. 1A illustrates a tunnel magnetoresistance (TMR) stack 100A. The TMR stack 100A comprises a bottom electrode 110A with ferromagnetic properties and a top electrode 130A with ferromagnetic properties, between which is a tunneling barrier 120A. As is known, the conductance of the tunneling barrier 120A varies depending on whether the top and bottom electrodes 110A, 130A are in parallel or anti-parallel with respect to their magnetic properties.

FIG. 1B illustrates a TMR resistor 100B. Similar to the TMR stack 100A, the TMR resistor 100B comprises a ferromagnetic bottom electrode 110B and a ferromagnetic top electrode 130B, between which is a tunneling barrier 120B. For the TMR resistor 100B, though, the top electrode 130B is etched using a standard TMR etch process to define a magnetically active area. The TMR resistor 100B has a negative temperature coefficient nTk, which means that that with increasing temperature its tunneling resistance decreases. The temperature coefficient may be approximately −0.1%/K.

FIG. 1C illustrates a bottom electrode resistor 100C. The bottom electrode resistor 100C comprises a ferromagnetic bottom electrode 110C and a tunneling barrier 120C. Contrary to the TMR resistor 100B, the bottom electrode resistor 100C has a positive temperature coefficient pTk, which means that with increasing temperature its resistance increases. The positive temperature coefficient pTk may be approximately +0.1%/K.

The bridge offset voltage compensation of this disclosure takes advantage of the usual structuring method of the TMR stack 100A that is performed in two steps. In the first step, the top electrode 130 is etched down to the tunneling barrier 120 to define sensor layer geometry. In the second step, the ferromagnetic bottom electrode 110 is structured in a further etch process. In a single deposition structuring process it is therefore possible to define both the TMR resistor 100B, as shown in FIG. 1B, and the ferromagnetic bottom electrode resistor 100C, as shown in FIG. 1C. In another embodiment, the etch process of the first step stops below the tunneling barrier 120 in or within the ferromagnetic bottom electrode 110 as shown in FIG. 1C.

Figure 2A:
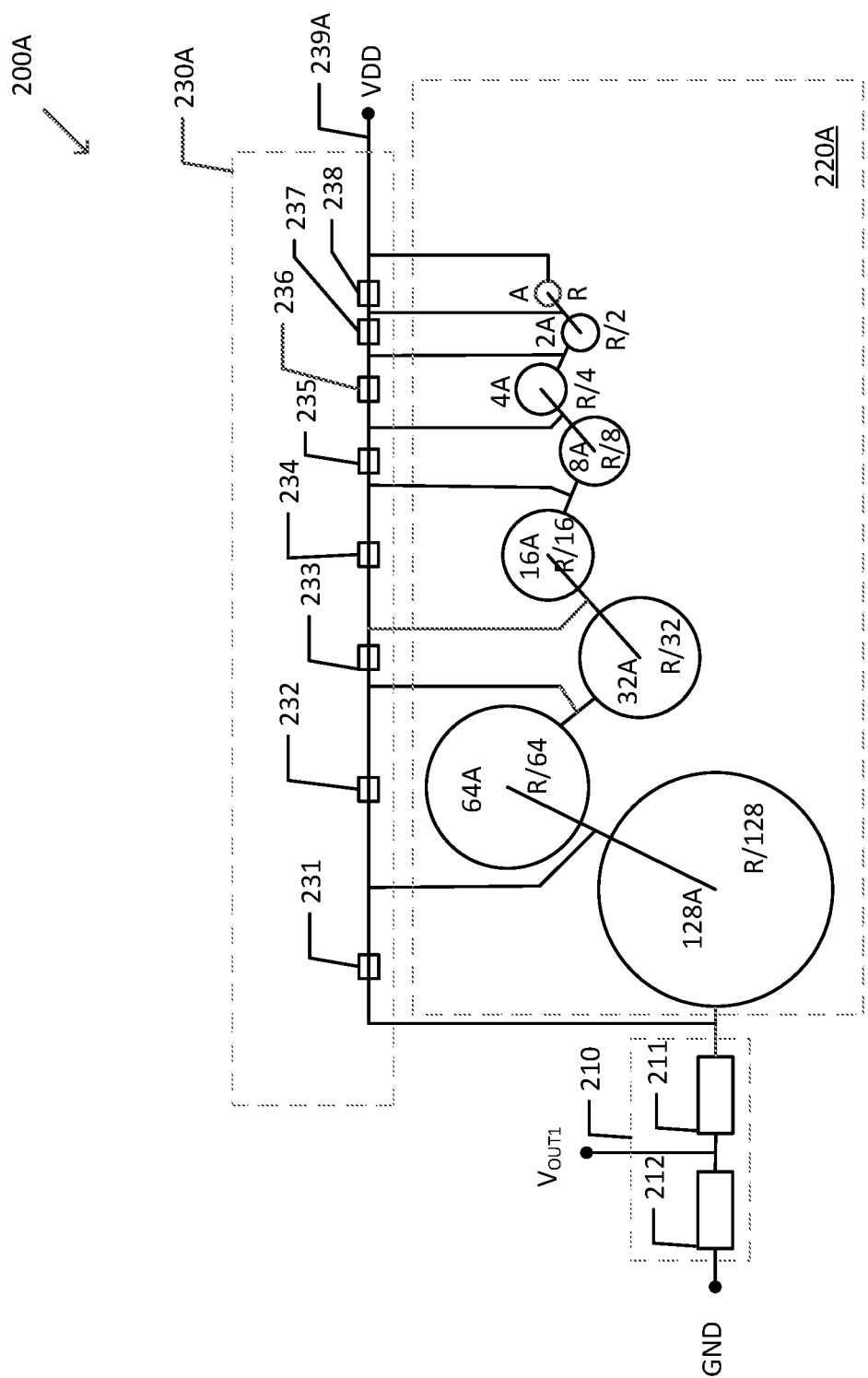
FIG. 2A illustrates a circuit for compensating for a bridge offset voltage in a full bridge using laser fuses.

FIG. 2A illustrates a circuit 200A for compensating for the bridge offset voltage in a full bridge, but without compensating for temperature coefficient Tk.

The bridge offset voltage compensation circuit 200A comprises a Wheatstone bridge, a TMR resistor cascade 220A, and a laser fuse circuit 230A.

Figure 4:
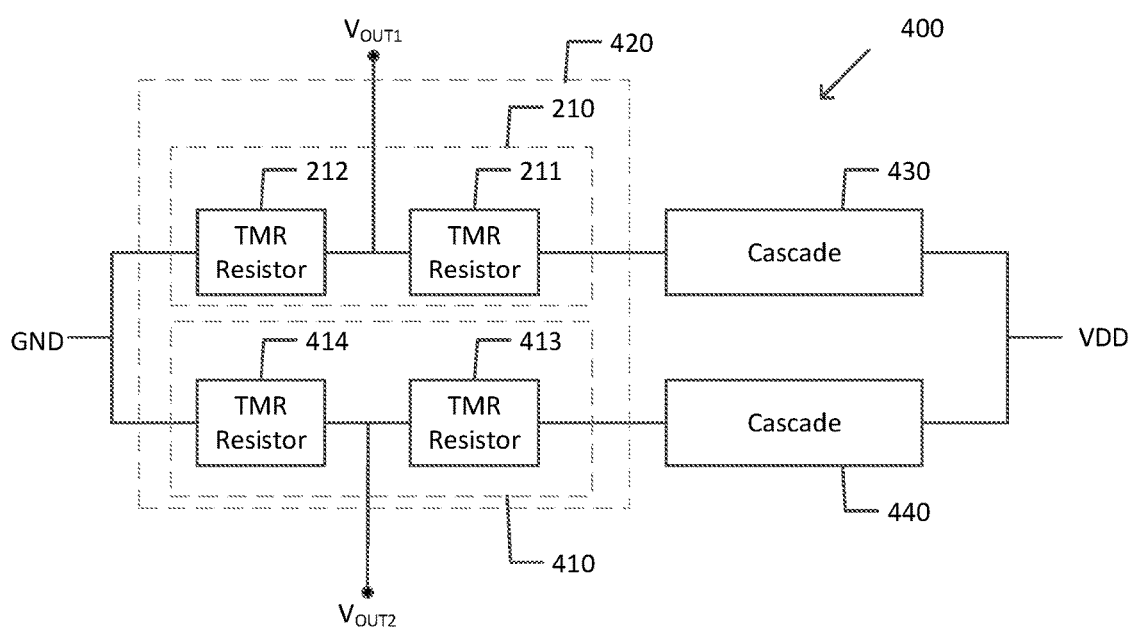
FIG. 4 illustrates a circuit, showing a full bridge circuit, for compensating for a bridge offset voltage, or for a bridge offset voltage and a temperature coefficient.

The Wheatstone bridge comprises a first branch circuit 210 and a second branch circuit (not shown) coupled in parallel. The first branch circuit 210 may include a first TMR resistor 211 and a second TMR resistor 212 coupled in series, between which is an output voltage point $V_{out1}$. Only the first branch circuit 210 of the Wheatstone bridge is shown for the sake of simplicity. Like the first branch circuit 210, the second branch circuit includes two TMR resistors coupled in series with an output voltage point between, as is shown in FIG. 4 and described below.

The TMR resistor cascade 220A is coupled in series with the first branch circuit 210, and is configured to provide a resistance to compensate for the bridge offset voltage. The TMR resistor cascade 220A in this example comprises eight TMR resistors, represented with references A, 2A, 4A, 8A, 16A, 32A, 64A, and 128A having resistances R, R/2, R/4, R/8, R/16, R/32, R/64, and R/128, respectively, where R represents a resistance value. The TMR resistor cascade 220A is configured to have a doubling of the area size, that is, a halfening of the resistance from resistor to resistor. The resistance is defined by the size of the top electrode 130, with the larger the size, the larger the current, and the lower the resistance. The thickness of the tunneling barrier 120 of the resistors of the TMR resistor cascade 220A is the same as that of the first and second TMR resistors 211, 212.

The TMR resistor cascade 220A having eight TMR resistors is not meant to be limiting. There may be any number of TMR resistors as suitable for the intended purpose. Also, a halfening of the resistance from resistor to resistor is also not required.

While not shown, the second branch circuit similarly has coupled in series a second cascade of TMR resistors, and is also configured to provide a resistance offset to compensate for the bridge offset voltage.

The laser fuse circuit 230A is coupled in parallel to the TMR resistor cascade 220A. The laser fuse circuit 230A comprises a low ohmic metal line 239, which is coupled to a voltage source VDD, and a plurality of laser fuses 231-238. The laser fuses 231-238 correspond with the TMR resistors 128A, 64A, 32A, 16A, 8A, 4A, 2A, and A, respectively, and are configured to adjust the resistance of the TMR resistor cascade 220A. More specifically, if additional resistance is required to compensate for the bridge offset voltage, individual laser fuses 231-238 are configured to break the low ohmic metal line 239 at predetermined locations to force current through a defined current flow path through the TMR resistor cascade 220A. In this example, any resistance between zero and 2R-R/128 can be realized with a resolution of R/128.

The laser fuse circuit 230A may alternatively be replaced with a low ohmic switch circuit. The low ohmic switch circuit comprises the low ohmic metal line 239 and a plurality of switches as monolithically integrated semiconductor switches in place of the plurality of laser fuses 231-238.

Figure 2B:
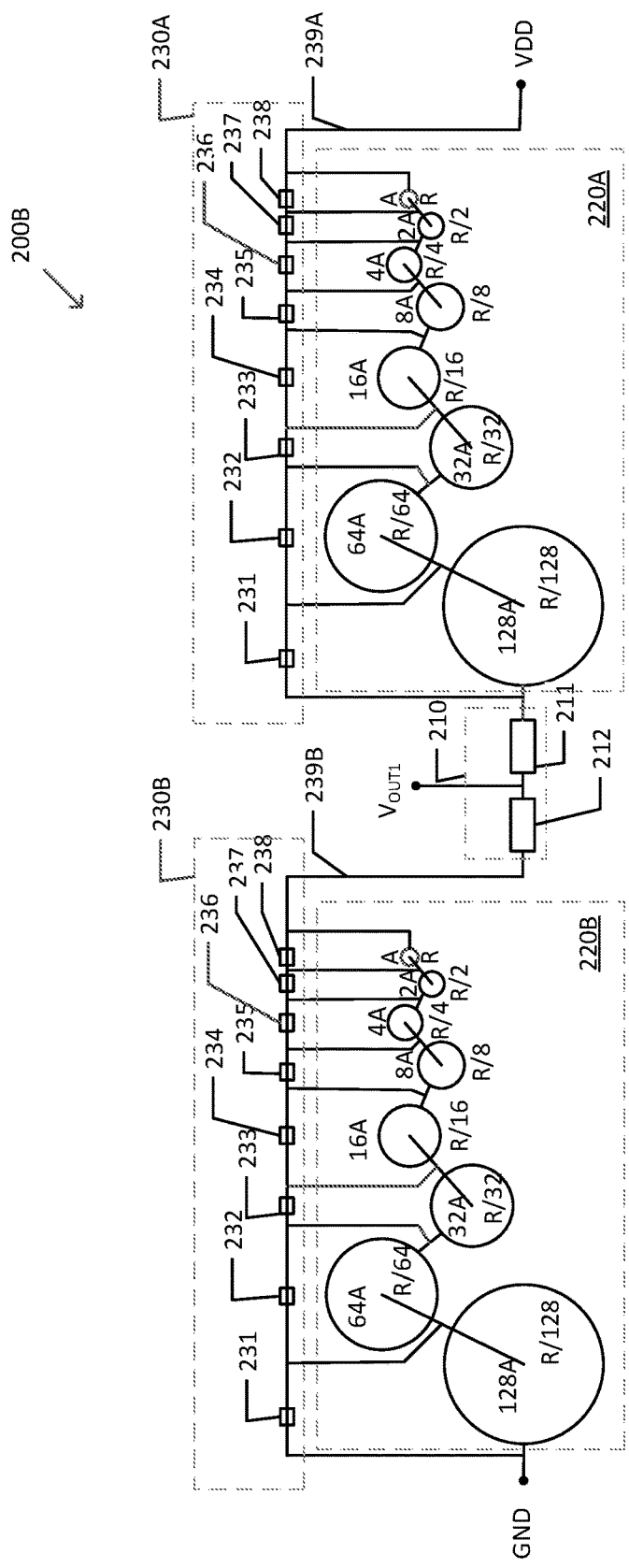
FIG. 2B illustrates a circuit for compensating for a bridge offset voltage in a half bridge using laser fuses.

FIG. 2B illustrates a circuit 200B for compensating for a bridge offset voltage in a half bridge using laser fuses. Circuit 200B is similar to circuit 200A of FIG. 2A, with the addition that a further TMR resistor cascade 220B, with corresponding laser fuse circuit 230B, is coupled in series between the GND terminal and the TMR resistor 212. In this circuit 200B, an offset compensation of a Wheatstone half-bridge configuration is enabled. Similar to the circuit 200A of FIG. 2A, the laser fuse circuit 230B may alternatively be replaced with a low ohmic switch circuit.

Figure 3:
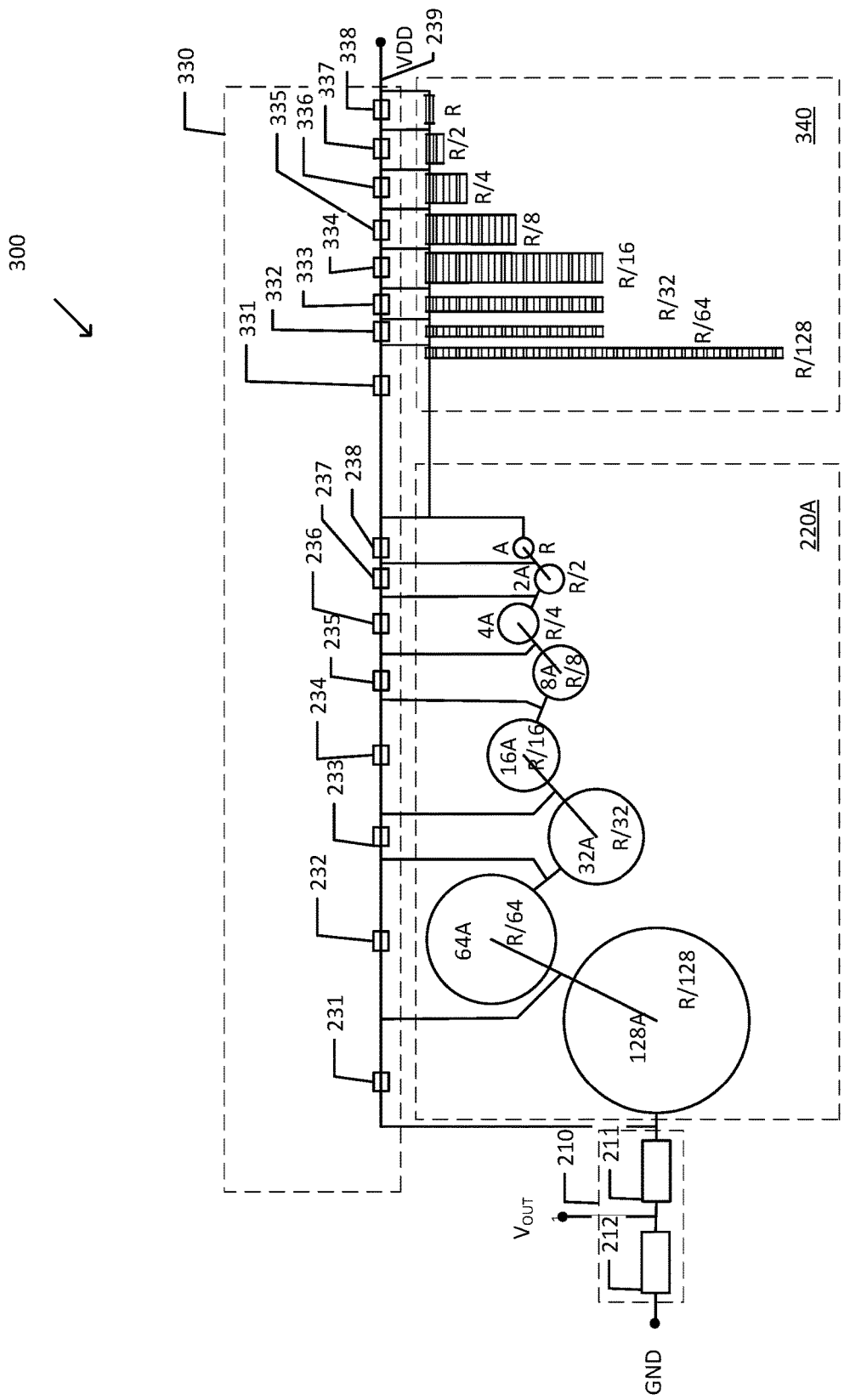
FIG. 3 illustrates a circuit for compensating for a bridge offset voltage and a temperature coefficient.

FIG. 3 illustrates a circuit 300 for compensating for the bridge offset voltage, with an additional compensation for temperature coefficient Tk.

The bridge offset voltage compensation circuit 300 comprises a Wheatstone bridge and a TMR resistor cascade 220A, as described above with respect to FIG. 2A, but now additionally includes a bottom electrode resistor cascade 340.

The bottom electrode resistor cascade 340 is coupled in series with the TMR resistor cascade 220A. The bottom electrode resistor cascade 340 in this example comprises eight bottom electrode resistors having resistances R, R/2, R/4, R/8, R/16, R/32, R/64, and R/128, where R represents a resistance value. Similar to the TMR resistor cascade 220A, the bottom electrode resistor cascade 340 is configured to have a doubling of the width at a certain length, that is, a halfening of the resistance from resistor to resistor. The disclosure is not limited to the bottom electrode resistor cascade 340 having eight resistors and/or a halfening of the resistance from resistor to resistor, but may be configured as suitable for the intended purpose.

The laser fuse circuit 330 includes the laser fuses 231-238 of FIG. 2A, and additionally includes laser fuses 331-338 to correspond with the bottom electrode resistors of the bottom electrode resistor cascade 340.

The TMR resistor cascade 220A has a negative temperature coefficient nTk, and the bottom electrode resistor cascade 340 has a positive temperature coefficient pTk, as described above. The resistance values of the cascades 220A, 340 to be adjusted to compensate for the bridge offset voltage can be calculated by first calculating a variable a in accordance with the following Equation 1:

$$\alpha = \frac{Tk\_Offset_{target}}{|TK\_R_{TMR}| + |Tk\_R_{Bottom}|}$$ (Equation 1)

where $Tk\_Offset_{target}$ is the measured temperature coefficient Tk of the offset voltage which is to be compensated. Further, $Tk\_R_{TMR}$ and $Tk\_R_{Bottom}$ denote the temperature coefficient of resistance of the TMR resistor cascade 220A and bottom electrode resistor cascade 340, respectively.

If the sign of the coefficient α is negative, then $$R_{Bottom} = \alpha \cdot R_{corr}$$

$$R_{TMR} = (1-\alpha) \cdot R_{corr}$$ (Equations 2A and 2B)

where $R_{Bottom}$ and $R_{TMR}$ denote the resistances to be adjusted by laser fusing for the TMR resistor cascade 220A and bottom electrode resistor cascade 340, respectively. $R_{Corr}$ is a resistance needed to compensate for the offset voltage of the bridge circuit.

Alternatively, if the sign of the coefficient α is positive, then $$R_{TMR} = \alpha \cdot R_{corr}$$

$$R_{Bottom} = (1-\alpha) \cdot R_{Corr}$$ (Equations 3A and 3B)

Any compensation resistance between zero and 2R-R/128 may be realized with any temperature coefficient offset Tk_Offset between $Tk\_R_{TMR}$ and $Tk\_R_{Bottom}$ to achieve a bridge offset voltage compensation having a temperature coefficient Tk of zero or substantially close to zero.

It is advantageous if the magnitudes of the resistances of the TMR resistor cascade 220A and the bottom electrode resistor cascade 340 are substantially equal. In such a case, the opposing temperature coefficients Tk of the TMR resistor cascade 220A and the bottom electrode resistor cascade 340 results in a bridge offset voltage compensation with a temperature coefficient Tk of zero or substantially close to zero.

While not shown, the second branch circuit similarly has coupled in series a second cascade of TMR resistors and a second cascade of bottom electrode resistors, and is also configured to provide a resistance offset to compensate for the bridge offset voltage with an additional compensation for temperature coefficient Tk.

Further, the circuit 300 is described as compensating for the bridge offset voltage and with an additional compensation for temperature coefficient Tk with respect to a full bridge. The concepts of circuit 300 are also applicable to a half bridge by the addition of a further TMR resistor cascade and a further bottom electrode resistor cascade coupled in series between the GND terminal and the TMR resistor 212, in a similar manner as described above with respect to the half bridge of the circuit 200B of FIG. 2B.

FIG. 4 illustrates a circuit 400 for compensating for a bridge offset voltage, or for a bridge offset voltage and a temperature coefficient. Circuit 400 shows a full Wheatstone bridge 420, as opposed to only the half shown in FIGS. 2 and 3.

The Wheatstone bridge 420 comprises a first branch circuit 210 and a second branch circuit 410 coupled in parallel. The first branch circuit 210 comprises TMR resistor 211 coupled to TMR resistor 212, between which is output voltage point $V_{OUT1}$. The second branch circuit 410 comprises TMR resistor 413 coupled to TMR resistor 414, between which is output voltage point $V_{OUT2}$. As is known, a voltage difference between output voltage points $V_{OUT1}$ and $V_{OUT2}$ represents the bridge offset voltage.

A first cascade of resistors 430 is coupled in series with the first branch circuit 210. This first cascade of resistors 430 may include the TMR resistor cascade 220A, or alternatively, a combination of the TMR resistor cascade 220A and the bottom electrode resistor cascade 340, as described above with respect to FIGS. 2A and 3, respectively. Similarly, the second cascade of resistors 440 is coupled in series with the second branch circuit 410, and is configured similarly as the first cascade of resistors 430.

If, by way of example, a bridge offset voltage is caused by the resistance of the TMR resistor 414 being too high, then the bridge offset voltage can be reduced by increasing the resistance of the second cascade 440, which is serially coupled to the TMR resistor 413. And if, for example, the bridge offset voltage is caused by a resistance of the TMR resistor 212 being too high, then the bridge offset voltage can be reduced by increasing the resistance of the first cascade 430, which is serially coupled to the TMR resistor 211. If each of the first and second cascades 430, 440 includes the combination of the TMR resistor cascade 220A and the bottom electrode resistor cascade 340, then the temperature coefficient Tk can also be reduced to zero or substantially close to zero.

Figure 5:
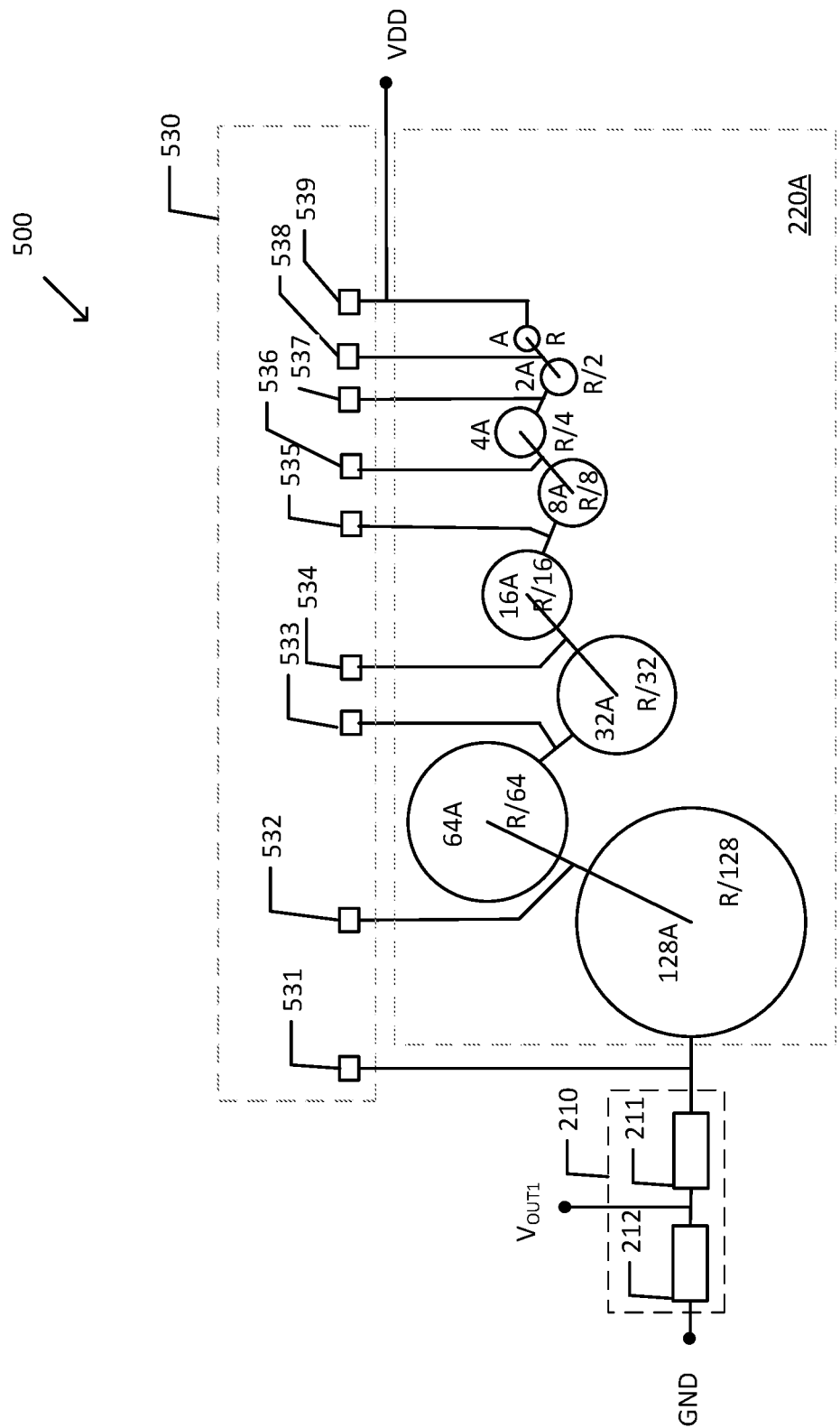
FIG. 5 illustrates a circuit for compensating for a bridge offset voltage using contact pads.

FIG. 5 illustrates a circuit 500 for compensating for a bridge offset voltage using contact pads.

This offset voltage compensation circuit 500 is similar to the offset voltage compensation circuit 200A of FIG. 2A, except that in place of the laser fuse circuit 230, there are a plurality of contact pads 530 (531-539) coupled between the respective TMR resistors of the TMR resistor cascade 220A.

A TMR resistor can be shorted by applying a voltage above a breakdown voltage $V_{BD}$ across its top and bottom electrodes 130B, 110B. The tunneling barrier 120B is destroyed and shorted permanently, resulting in the TMR resistor having a low resistance.

The contact pads 531-539 may be used to short any of the TMR resistors of the TMR resistor cascade 220A, thereby adjusting the resistance of the TMR resistor cascade 220A in an electrical manner. For example, when a voltage greater than the breakdown voltage $V_{BD}$ is applied to contact pads 538 and 539, the first TMR resistor R is shorted, thereby reducing the resistance of the TMR resistor cascade 220A by R. Using this method, it is possible to compensate for the bridge offset voltage in an electrical manner without the use of a laser or switch.

While not shown, the second branch circuit similarly has coupled in series a second cascade of TMR resistors, and is also configured to provide a resistance offset to compensate for the bridge offset voltage.

Further, the circuit 500 is described as compensating for the bridge offset voltage with respect to a full bridge. The concepts of circuit 500 are also applicable to a half bridge by the addition of a further TMR resistor cascade coupled in series between the GND terminal and the TMR resistor 212, in a similar manner as described above with respect to the half bridge of the circuit 200B of FIG. 2B.

Figure 6A:
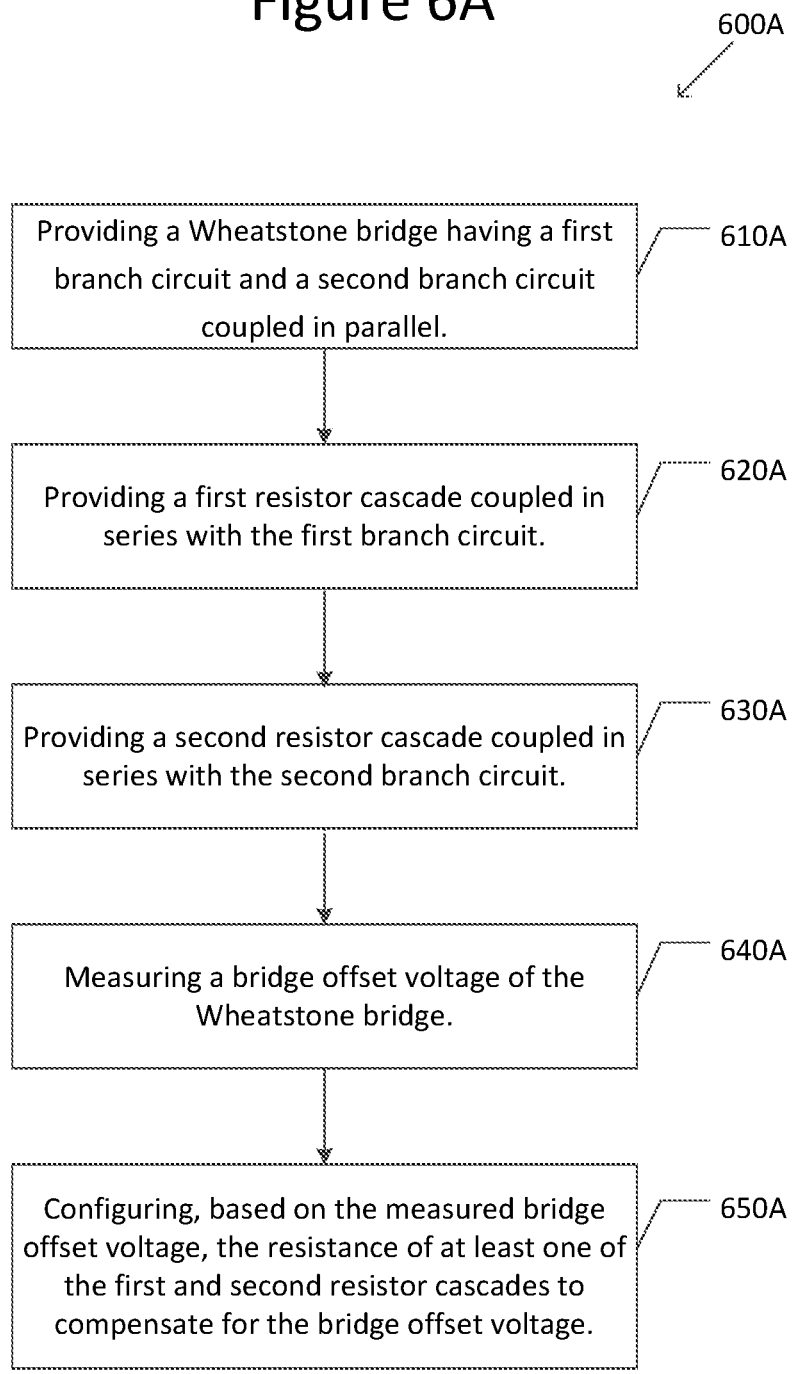
FIG. 6A illustrates a flowchart of a method for compensating for a bridge offset voltage in a full bridge.

FIG. 6A illustrates a flowchart 600A of a method for compensating for a bridge offset voltage in a full bridge.

At Step 610A, a Wheatstone bridge 420 having a first branch circuit 210 and a second branch circuit 410 coupled in parallel is provided.

At Step 620A, a first resistor cascade 430 is coupled in series with the first branch circuit 210.

At Step 630A, a second resistor cascade 440 is coupled in series with the second branch circuit 410.

At Step 640A, a bridge offset voltage of the Wheatstone bridge 420 is measured. This measuring step 640A may be performed using the calculations described above with respect to FIG. 3.

At Step 650A, the resistance of at least one of the first and second resistor cascades 430, 440, is configured, based on the measured bridge offset voltage, to provide a resistance to compensate for the bridge offset voltage.

The bridge circuit is shown as a Wheatstone bridge, though the disclosure is not limited in this respect. The disclosure is applicable to any circuit where the resistance needs to be adjusted to a high accuracy. Also, the bridge circuit may be comprised within a sensor, such as a sensor found in an automobile, though the disclosure is not limited in this respect.

FIG. 6B illustrates a flowchart 600B of a method for compensating for a bridge offset voltage in a half bridge.

At Step 610B, a half bridge circuit having a branch circuit 210 is provided.

At Step 620B, a TMR resistor cascade 220B is coupled in series with the branch circuit 210.

At Step 640B, a bridge offset voltage of the branch circuit 210 is measured. This measuring step 640B may be performed using the calculations described above with respect to FIG. 3.

At Step 650B, the resistance of the TMR resistor cascade 220B is configured, based on the measured bridge offset voltage, to provide a resistance to compensate for the bridge offset voltage.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. A bridge circuit, comprising:
   a full-bridge circuit having a first branch and a second branch coupled in parallel,
      the first branch comprising:
         a first half-bridge circuit comprising a first tunnel magnetoresistance (TMR) resistor and a second TMR resistor; and
         a first TMR resistor cascade, which comprises a plurality of TMR resistors none of which form part of the first half-bridge circuit, coupled in series with the first half-bridge circuit;
         a first electrode resistor cascade coupled in series with the first TMR resistor cascade,
            wherein the first TMR resistor cascade has a negative temperature coefficient, and the first electrode resistor cascade has a positive temperature coefficient; and
      the second branch comprising:
         a second half-bridge circuit comprising a third TMR resistor and a fourth TMR resistor; and
         a second TMR resistor cascade, which comprises a plurality of TMR resistors none of which form part of the first half-bridge circuit, coupled in series with the second half-bridge circuit;
         a second electrode resistor cascade coupled in series with the second TMR resistor cascade, wherein the second TMR resistor cascade has a negative temperature coefficient, and the second electrode resistor cascade has a positive temperature coefficient, wherein the full-bridge circuit has an offset voltage having an offset temperature coefficient of zero.

2. The bridge circuit of claim 1, further comprising:
a first metal line coupled in parallel to the first TMR resistor cascade and the first electrode resistor cascade, and having fuses; and
a second metal line coupled in parallel to the second TMR resistor cascade and the second electrode resistor cascade, and having fuses.

3. The bridge circuit of claim 1, wherein resistance values of TMR resistors of the first TMR resistor cascade increase from resistor to resistor by a factor of two, and resistance values of TMR resistors of the second TMR resistor cascade increase from resistor to resistor by a factor of two.

4. The bridge circuit of claim 1, wherein the full-bridge circuit is a Wheatstone bridge.

5. The bridge circuit of claim 1, wherein
a magnitude of a resistance of the first TMR resistor cascade and a magnitude of a resistance of the first electrode resistor cascade are equal, and
a magnitude of a resistance of the second TMR resistor cascade and a magnitude of a resistance of the second electrode resistor cascade are equal.

6. A sensor comprising:
a full-bridge circuit having a first branch and a second branch coupled in parallel,
the first branch comprising:
a first half-bridge circuit comprising a first tunnel magnetoresistance (TMR) resistor and a second TMR resistor;
a first TMR resistor cascade, which comprises a plurality of TMR resistors none of which form part of the first half-bridge circuit, coupled in series with the first half-bridge circuit;
a first electrode resistor cascade coupled in series with the first TMR resistor cascade,
wherein the first TMR resistor cascade has a negative temperature coefficient, and the first electrode resistor cascade has a positive temperature coefficient;
the second branch comprising:
a second half-bridge circuit comprising a third TMR resistor and a fourth TMR resistor;
a second TMR resistor cascade, which comprises a plurality of TMR resistors none of which form part of the first half-bridge circuit, coupled in series with the second half-bridge circuit;
a second electrode resistor cascade coupled in series with the second TMR resistor cascade,
wherein the second TMR resistor cascade has a negative temperature coefficient, and the second electrode resistor cascade has a positive temperature coefficient,
wherein the full-bridge circuit has an offset voltage having an offset temperature coefficient of zero.

* * * * *